(12) United States Patent
Nam et al.

(10) Patent No.: US 10,529,754 B2
(45) Date of Patent: Jan. 7, 2020

(54) OMNIDIRECTIONAL IMAGE SENSOR AND MANUFACTURING METHOD THEREOF

(71) Applicants: SAMSUNG ELECTRONICS CO., LTD., Suwon-si (KR); SNU R&DB FOUNDATION, Seoul (KR)

(72) Inventors: Dong Kyung Nam, Yongin-si (KR); Dae Hyeong Kim, Incheon (KR); Yang Ho Cho, Seongnam-si (KR); Mincheol Lee, Seoul (KR); Jun Kyul Song, Seoul (KR)

(73) Assignees: SAMSUNG ELECTRONICS CO., LTD., Suwon-si (KR); SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 15/923,723

(22) Filed: Mar. 16, 2018

(65) Prior Publication Data

US 2019/0067347 A1 Feb. 28, 2019

(30) Foreign Application Priority Data

Aug. 29, 2017 (KR) ........................ 10-2017-0109631

(51) Int. Cl.
*H01L 27/146* (2006.01)
*H01L 31/0203* (2014.01)
(52) U.S. Cl.
CPC .. *H01L 27/14605* (2013.01); *H01L 27/14627* (2013.01); *H01L 27/14643* (2013.01);
(Continued)

(58) Field of Classification Search
CPC ....... H01L 27/14603–14616; H01L 27/14618; H01L 27/1462–14623;
(Continued)

(56) References Cited

U.S. PATENT DOCUMENTS

2012/0261551 A1 10/2012 Rogers
2013/0316487 A1* 11/2013 de Graff ........... H01L 27/14683
438/66
(Continued)

FOREIGN PATENT DOCUMENTS

CN 105282464 A 1/2016
JP 2009-55554 A 3/2009
(Continued)

OTHER PUBLICATIONS

Young Min Song et al, "Digital cameras with designs inspired the arthropod eye", Nature, Journal Club—Bilkent University Institute of Materials Science and Nanotechnology UNAM, May 21, 2013, total 9 pages, vol. 497, doi:10.1038/nature12083.
(Continued)

*Primary Examiner* — Shahed Ahmed
(74) *Attorney, Agent, or Firm* — Sughrue Mion, PLLC

(57) ABSTRACT

An omnidirectional image sensor and a method of manufacturing the omnidirectional image sensor are provided. An image sensor may include a plurality of photodiodes, and a spherical structure comprising a plurality of protrusions, wherein the plurality of photodiodes are disposed between the plurality of protrusions, and wherein the spherical structure comprises a plurality of spherical wedges.

10 Claims, 14 Drawing Sheets

(52) U.S. Cl.
CPC .. *H01L 27/14685* (2013.01); *H01L 27/14687* (2013.01); *H01L 31/0203* (2013.01)

(58) Field of Classification Search
CPC ....... H01L 27/14625–14629; H01L 27/14605; H01L 27/14627; H01L 27/14643; H01L 27/14685; H01L 27/14687; H01L 31/0203
See application file for complete search history.

(56) References Cited

U.S. PATENT DOCUMENTS

| | | | |
|---|---|---|---|
| 2014/0146132 A1* | 5/2014 | Bagnato | G02B 27/2228 348/36 |
| 2018/0224332 A1* | 8/2018 | Ooi | G01J 3/26 |
| 2018/0335555 A1* | 11/2018 | Wang | G02B 5/281 |

FOREIGN PATENT DOCUMENTS

| KR | 10-2010-0123755 A | 11/2010 |
|---|---|---|
| KR | 10-2016-0101539 A | 8/2016 |
| KR | 10-2017-0056690 A | 5/2017 |

OTHER PUBLICATIONS

Dario Floreano et al., "Miniature curved artificial compound eyes," Proceedings of the National Academy of Sciences (PNAS), Jun. 4, 2013, total 13 pages, vol. 10, No. 23, www.pnas.org/cgi/doi/10.1073/pnas.1219068110.

* cited by examiner

OMNIDIRECTIONAL IMAGE SENSOR AND MANUFACTURING METHOD THEREOF

CROSS-REFERENCE TO RELATED APPLICATION

This application claims priority from Korean Patent Application No. 10-2017-0109631, filed on Aug. 29, 2017, in the Korean Intellectual Property Office, the disclosure of which is incorporated herein by reference in its entirety.

BACKGROUND

1. Field

Methods and apparatuses consistent with exemplary embodiments relate to an omnidirectional image sensor and a method of manufacturing the omnidirectional image sensor.

2. Description of the Related Art

An image sensor with a structure of a compound eye of an insect has been developed by combining microlenses formed using a polymer and an elastic photodiode. By forming the image sensor on a convex hemispherical structure, a digital image sensor having a wide viewing angle has been developed.

However, a process of combining the image sensor and the hemispherical structure may be less accurate and a viewing angle may be limited. Also, it may be more difficult to form a thinner and convex microlens and more difficult to bond the microlens to a device due to a curvature.

A structure of combining polymer microlenses and a photodetector array using a very-large-scale integration (VLSI) technology has been developed on a printed circuit board (PCB). Also, the structure has been developed to be bendable in one direction using a dicing technology, and has been modified to have a convex curved surface, to form an imaging device having a wide viewing angle.

However, since the above bendable shaped structure has been developed using the dicing technology, the structure developed may be limited due to a curvature. Accordingly, a viewing angle may be limited.

Thus, there is a desire for an enhanced fabrication process and a technology for realizing an image sensor with a wide viewing angle.

SUMMARY

One or more exemplary embodiments provide an image sensor having a wide viewing angle.

According to an aspect of an exemplary embodiment, there is provided an image sensor including a plurality of photodiodes, and a structure including a plurality of protrusions, wherein the plurality of photodiodes are disposed between the plurality of protrusions.

The structure may be a spherical structure including a plurality of spherical wedges, wherein each of the plurality of spherical wedges includes a first spherical wedge with a first radius and a second spherical wedge with a second radius, and the spherical structure may be configured by alternately connecting the first spherical wedge and the second spherical wedge to form the plurality of protrusions.

The plurality of photodiodes may be located on a spherical lune of a spherical wedge with a smaller radius among the first spherical wedge and the second spherical wedge.

The plurality of photodiodes may be encapsulated with an organic polymer.

The plurality of photodiodes may be configured as lateral photodiodes.

The image sensor may further include a plurality of microlenses disposed on the plurality of photodiodes.

The plurality of microlenses may be configured as Fresnel zone plates (FZPs).

The image sensor may further include a medium layer disposed between each of the plurality of microlenses and each of the plurality of photodiodes, respectively, and configured to adjust a focal length.

The plurality of photodiodes, the medium layer and the plurality of microlenses may be bonded using transfer printing.

The medium layer may be formed of polydimethylsiloxane (PDMS).

According to an aspect of an exemplary embodiment, there is provided a method of manufacturing an image sensor, the method including generating a plurality of photodiodes, and bonding the plurality of photodiodes between a plurality of protrusions included in a structure.

The structure may be a spherical structure including a plurality of spherical wedges, and wherein the plurality of spherical wedges may include a first spherical wedge with a first radius and a second spherical wedge with a second radius, and the spherical structure may be configured by alternately connect the first spherical wedge and the second spherical wedge to form the plurality of protrusions.

The plurality of photodiodes may be disposed on a spherical lune of a spherical wedge with a smaller radius among the first spherical wedge and the second spherical wedge.

The generating may include encapsulating the plurality of photodiodes with an organic polymer.

The plurality of photodiodes may be configured as lateral photodiodes.

The method may further include disposing a plurality of microlenses on the plurality of photodiodes.

The plurality of microlenses may be configured as Fresnel zone plates (FZPs).

The method may further include disposing a medium layer between each of the plurality of microlenses and each of the plurality of photodiodes, respectively, the medium layer being configured to adjust a focal length.

The method may further include bonding the plurality of photodiodes, the medium layer, and the plurality of microlenses using transfer printing.

The medium layer may be formed of polydimethylsiloxane (PDMS).

BRIEF DESCRIPTION OF THE DRAWINGS

The above and/or other aspects will be more apparent by exemplary embodiments with reference to the accompanying drawings, in which.

DETAILED DESCRIPTION

Figure 1:
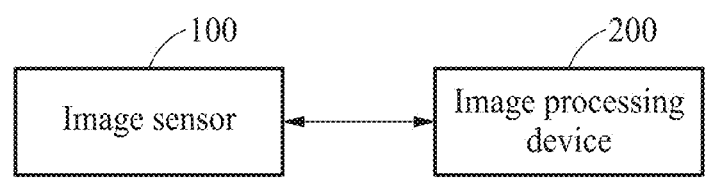
FIG. 1 is a block diagram illustrating an imaging system according to an exemplary embodiment.

The following structural or functional descriptions are exemplary to merely describe the exemplary embodiments, and the scope of the exemplary embodiments is not limited to the descriptions provided in the present specification. Various changes and modifications can be made thereto by those of ordinary skill in the art.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

Hereinafter, exemplary embodiments will be described in detail with reference to the accompanying drawings, and like reference numerals in the drawings refer to like elements throughout.

FIG. 1 is a block diagram illustrating an imaging system 10 according to an exemplary embodiment.

Referring to FIG. 1, the imaging system 10 may include an image sensor 100 and an image processing device 200.

The imaging system 10 may process, using the image processing device 200, an image acquired by the image sensor 100.

The image sensor 100 may sense light using a light sensing device. The image sensor 100 may convert the sensed light into electrical information and may output the electrical information to the image processing device 200.

The image processing device 200 may control an overall operation of the imaging system 10 based on the electrical information received from the image sensor 100. The image processing device 200 may be implemented as, for example, an integrated circuit (IC), a system on chip (SoC), or a printed circuit board (PCB) such as a motherboard. For example, the image processing device 200 may be an application processor.

Figure 2:
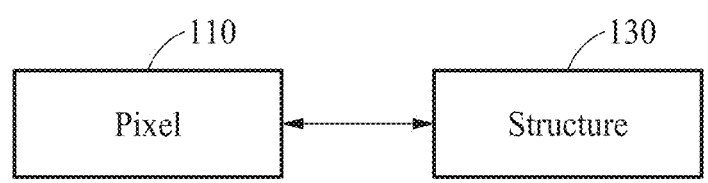
FIG. 2 is a block diagram illustrating an image sensor of FIG. 1.
Figure 3:
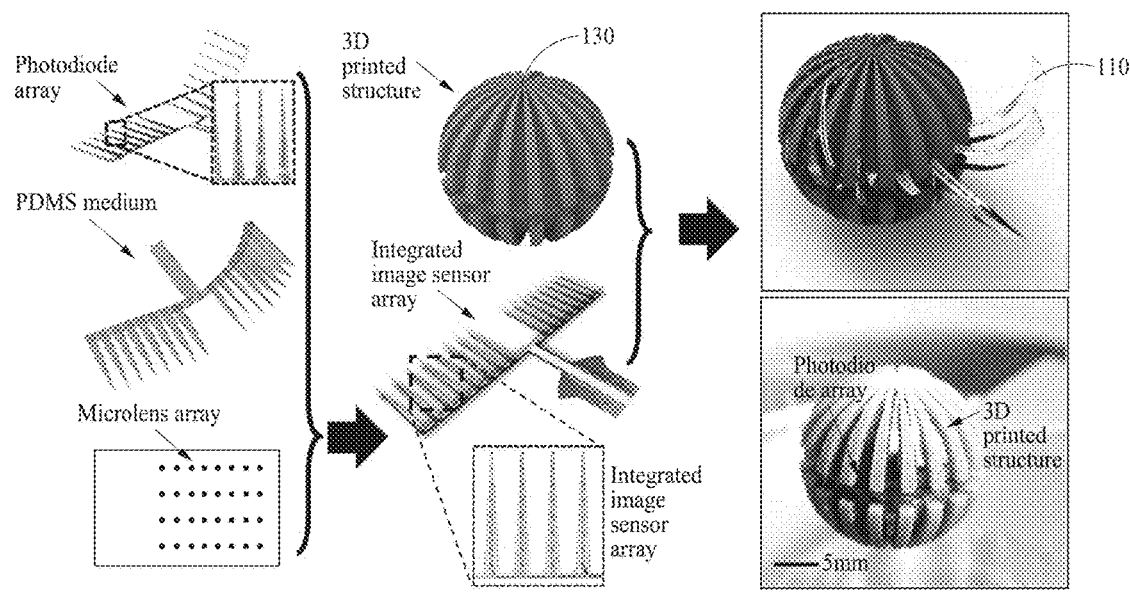
FIG. 3 is a diagram illustrating an example of a structure of the image sensor of FIG. 1.

FIG. 2 is a block diagram illustrating the image sensor 100 of FIG. 1, and FIG. 3 is a diagram illustrating an example of a structure of the image sensor 100.

Referring to FIG. 2, the image sensor 100 may include a pixel 110 and a structure 130. The pixel 110 may receive light and convert the light into a current. The pixel 110 may be bonded to the structure 130 and may receive light. The pixel 110 may have a flexible characteristic and may be connected to the structure 130 with a curve.

Referring to FIG. 3, the image sensor 100 may include a plurality of photodiodes, a plurality of protrusions, and a structure configured to allow the plurality of photodiodes to be located between the plurality of protrusions.

The image sensor 100 may include a plurality of pixels 110 configured to sense light, and the structure 130 bonded to the plurality of pixels 110. Each of the pixels 110 may include a photodiode, a medium layer, and a microlens. A plurality of photodiodes and a plurality of microlenses may be provided and may form an array. The medium layer may be formed of polydimethylsiloxane (PDMS).

The plurality of pixels may be bonded in a form of an array. The plurality of pixels may form an integrated image sensor array.

The structure 130 may include a plurality of protrusions, and the plurality of photodiodes may be located between the plurality of protrusions. The structure 130 may reduce an interference between devices by blocking light from a back side of the pixel 110.

The structure 130 may be a spherical structure that includes a plurality of spherical wedges.

The spherical wedge may refer to a portion of a ball bounded by two plane semidisks and a spherical lune. The two plane semidisks bounding the spherical wedge may have a predetermined dihedral angle.

The spherical lune may refer to an area on a sphere bounded by two half great circles that meet at antipodal points.

The structure 130 may include a first spherical wedge with a first radius and a second spherical wedge with a second radius. The first radius and the second radius may be the same as or different from each other. In FIG. 3, for example, the first radius and the second radius are different from each other.

The first spherical wedge and the second spherical wedge may be alternately connected, to form a protrusion of the structure 130.

For example, when the first radius and the second radius are the same, a complete spherical structure may be formed.

Figure 4:
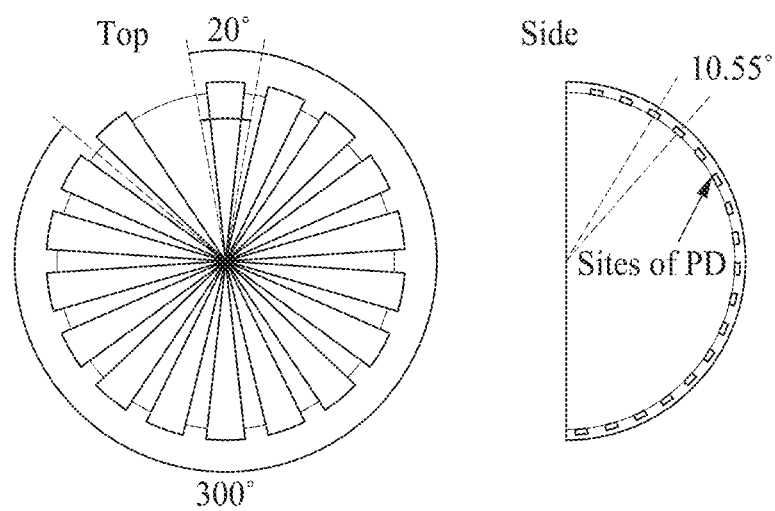
FIG. 4 is a diagram illustrating a top view and a side view of a structure of FIG. 2.

FIG. 4 illustrates an example in which protrusions are formed based on the first radius and the second radius being different from each other.

The plurality of photodiodes may be located between the protrusions of the structure 130, and thus the image sensor 100 may have a wider viewing angle similar to the viewing angle of eyes of a fiddler crab.

The eyes of the fiddler crab may have an ommateum structure similar to a structure of an insect eye. The ommateum structure may be a structure in which ommatidia includes a retinula, a vitreous humour, and a cornea such as human eyes.

The eyes of the fiddler crab may have a viewing angle close to 360 degrees due to a structure in which an ommateum covers an eye-stalk. The plurality of pixels may be bonded to the structure 130, and thus the image sensor 100 may have a wide viewing angle.

The structure 130 may be generated using a three-dimensional (3D) printer. The structure 130 may operate as a guide to connect a spherical surface of the structure 130 to a device that is manufactured by bonding a photodiode 111, a medium layer 113, and a microlens 115 of FIG. 5.

The plurality of photodiodes may be bonded to the structure 130, and thus an image senor having a wide viewing angle may be manufactured.

The plurality of pixels including the photodiodes may be located on a spherical lune of a spherical wedge with a smaller radius among the first spherical wedge and the second spherical wedge. For example, a spherical lune of a spherical wedge with a relatively small radius may correspond to a gap between protrusions, and a photodiode may be located between the protrusions.

FIG. 4 illustrates a top view and a side view of the structure 130 of FIG. 2.

Referring to FIG. 4, the first spherical wedge and the second spherical wedge may be alternately connected at regular intervals. The protrusions may be repeatedly formed at regular intervals. For example, an interval between protrusions may be 20 degrees. However, exemplary embodiments are not limited thereto.

Also, to place a wiring, a portion of the structure 130 may not include a photodiode. For example, photodiodes may be located on a surface of a spherical lune having a region of 300 degrees, and a wiring may be located on a remaining portion of a spherical lune having a region of 60 degrees. However, exemplary embodiments are not limited thereto.

The pixels 110 may be arranged at intervals with a predetermined central angle. For example, the pixels 110 may be bonded to a surface of a spherical lune having a central angle of 10.55 degrees and having a smaller radius.

Figure 5:
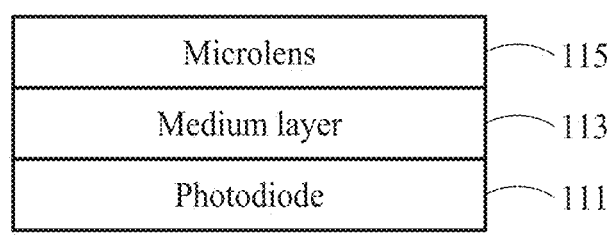
FIG. 5 is a diagram illustrating a structure of a pixel of FIG. 2.
Figure 6:
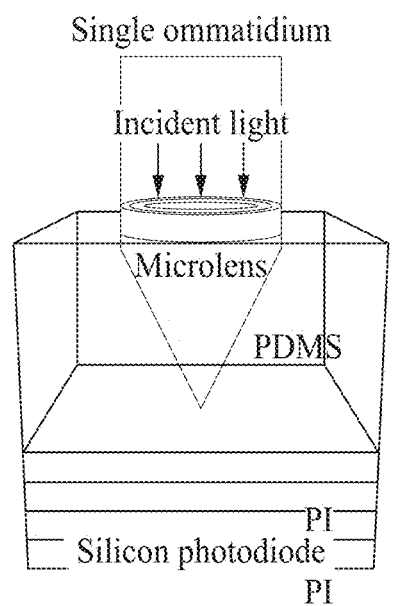
FIG. 6 is a diagram illustrating an implementation of the pixel of FIG. 5.

FIG. 5 is a diagram illustrating a structure of the pixel 110 of FIG. 2, and FIG. 6 is a diagram illustrating an implementation of the pixel 110.

Referring to FIG. 5, the pixel 110 may include the photodiode 111, the medium layer 113, and the microlens 115.

In the pixel 110, the photodiode 111, the medium layer 113, and the microlens 115 may be sequentially formed. The microlens 115 may be located above the photodiode 111, and the medium layer 113 may be located between the microlens 115 and the photodiode 111.

The photodiode 111, the medium layer 113, and the microlens 115 of the pixel 110 may be formed of flexible materials and may be bent.

Referring to FIG. 6, the pixel 110 structure may correspond to an ommatidium of an arthropod. The pixel 110 may collect light using the microlens 115, may adjust a focal length using the medium layer 113, and may convert light sensed by the photodiode 111 into a current.

To be more flexible, the photodiode 111, the medium layer 113, and the microlens 115 may be formed of polymer materials. For example, the photodiode 111 may be formed on a polyimide (PI) substrate, and the medium layer 113 may be formed of PDMS.

Figure 7:
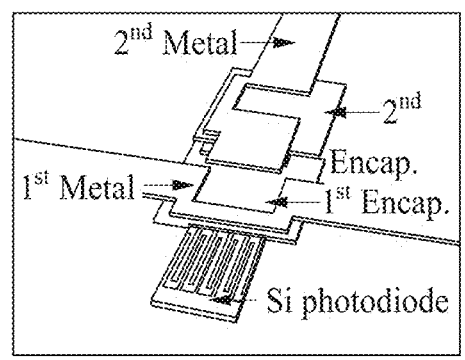
FIG. 7 is a diagram illustrating an implementation of a photodiode of FIG. 5.
Figure 7:
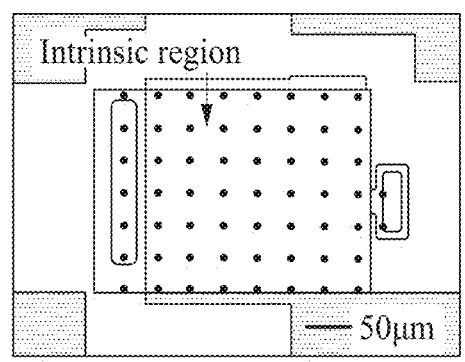
Figure 7:
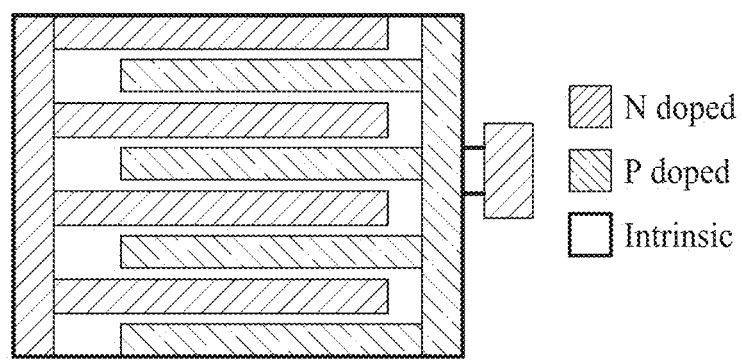

FIG. 7 is a diagram illustrating an example implementation of the photodiode 111 of FIG. 5.

Referring to FIG. 7, a plurality of photodiodes may be implemented as lateral photodiodes. However, exemplary embodiments are not limited thereto.

The photodiode 111 may be formed, for example, in a lateral PIN structure using a single-crystal silicon layer obtained from a silicon-on-insulator (SOI) wafer. For example, silicon (Si) of the SOI wafer may have a thickness of 1.25 micrometers (μm).

For a more thin diode, P/N-doped Si may be fabricated in a planar structure instead of a vertical structure. The photodiode 111 may be fabricated in an interdigit structure to increase a width of a channel.

A plurality of photodiodes 111 may be provided and may form an array. The plurality of photodiodes may be encapsulated with an organic polymer.

When a thermal vacuum evaporation of metals is performed on a transferred photodiode 111, an encapsulation process may be performed.

For example silicon dioxide (SiO2) may be deposited on the SOI wafer, a doping region may be set through patterning, and a spin-on dopant process may be performed, to form a P region and an N region. A hole may be formed from a top silicon layer to an oxide layer that is located in a lower portion, using a hole pattern. By penetrating a hydrofluoric acid (HF) solution into the hole, the oxide layer may be removed, and the top silicon layer may be separated from the SOI wafer.

A PI substrate may be formed by coating on a SiO2 wafer. A doped silicon layer may be transferred to the PI substrate using a transfer printing scheme using PDMS.

The photodiode 111 may have an interdigit structure with P-doped Si, intrinsic Si and N-doped Si. For example, the photodiode 111 formed on a Si wafer may be covered with a first encapsulation layer, and a first metal layer may be formed using a thermal vacuum evaporation. For example, the first encapsulation layer may be a PI layer, and the first metal layer may be an gold(Au)/chromium(Cr) layer.

The Si wafer and first metal layer may be connected via a hole formed on a PI. To separate the first metal layer from a second metal layer, a second encapsulation layer may be formed on the first metal layer. The second metal layer may be formed on the second encapsulation layer through the thermal vacuum evaporation and patterning. For example, the second encapsulation layer may be a PI layer, and the second metal layer may be an Au/Cr layer.

Figure 8:
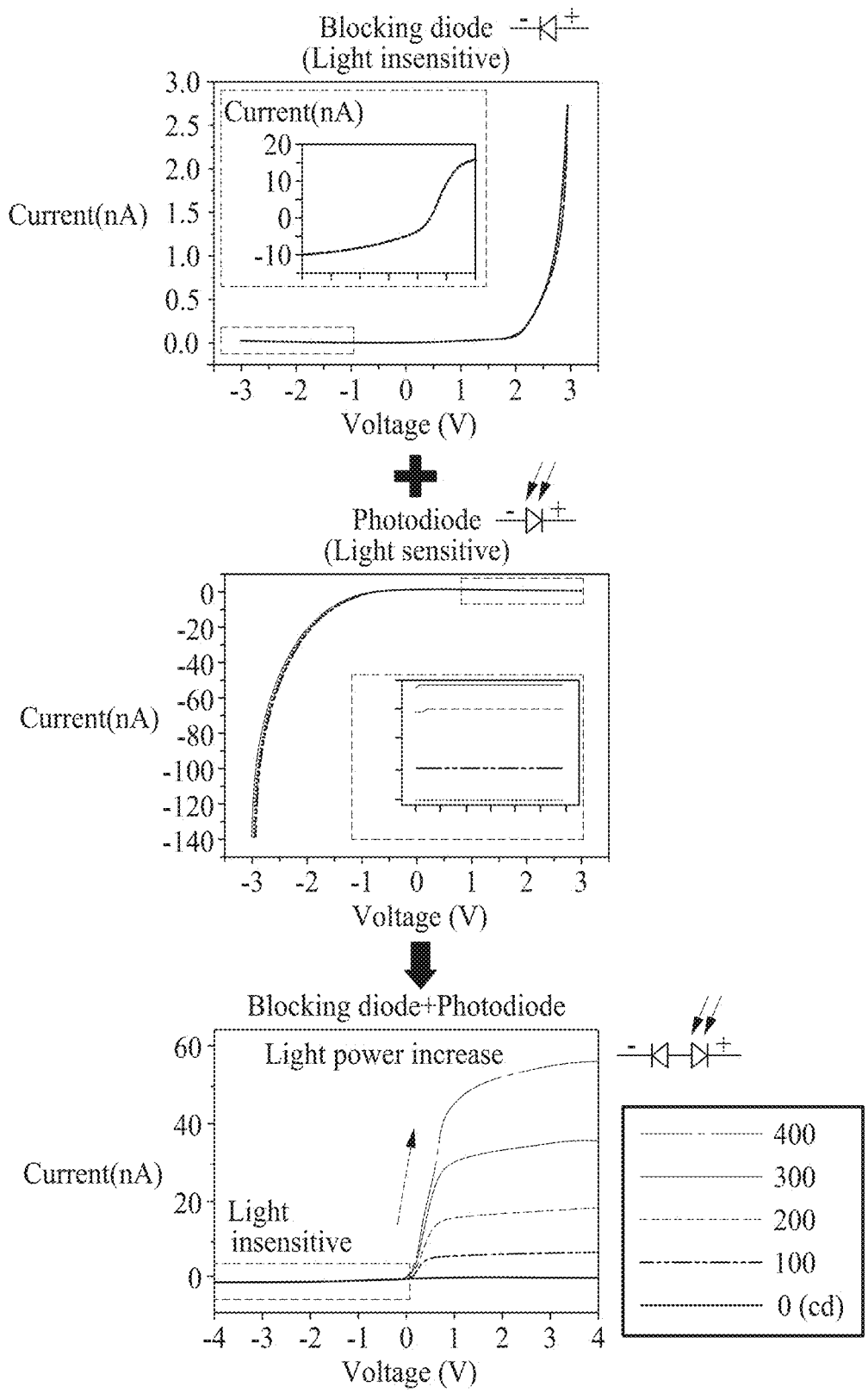
FIG. 8 is a diagram illustrating an operation performance of the photodiode of FIG. 7.

FIG. 8 is a diagram illustrating an operation performance of the photodiode 111 of FIG. 7.

The photodiode 111 may have, for example, a NIPIN structure. One side of the photodiode 111 may react to light, and the other side may block light and interrupt a flow of current.

The NIPIN structure may be a structure in which a NIP diode and a PIN diode are connected. The PIN diode may operate as a blocking diode. An intrinsic region of the blocking diode may be covered with a metal, to block light. Accordingly, the intrinsic region may be insensitive to light. An intrinsic region of the NIP diode may generate current due to a carrier formed by light.

An amount of current flowing in the photodiode 111 may linearly increase based on an intensity of emitted light.

Figure 9:
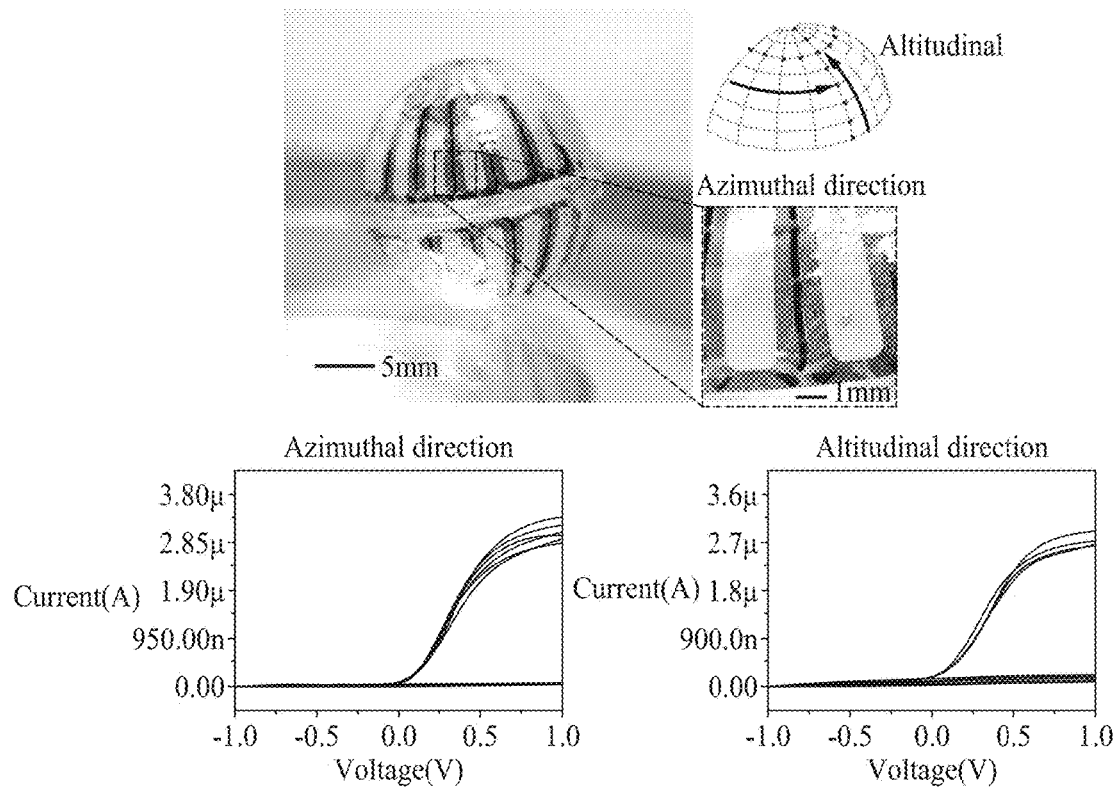
FIG. 9 is a diagram illustrating an operation performance of the photodiode of FIG. 7 when the photodiode is bonded to a structure.

FIG. 9 is a diagram illustrating an operation performance of the photodiode 111 of FIG. 7 when the photodiode 111 is bonded to a structure.

Referring to FIG. 9, the photodiode 111 with a flexible shape may be transferred onto the structure 130. For example, the structure 130 may be a spherical structure that does not include a protrusion because the first radius and the second radius are the same. The transferred photodiode 111 may represent a change in the current based on a presence or absence of light based on a spherical shape of the structure 130.

Although the transferred photodiode 111 in a bent state may be bonded to the structure 130, a difference in performance based on a location may be reduced with respect to an altitudinal direction and an azimuthal direction of the structure 130.

Figure 10:
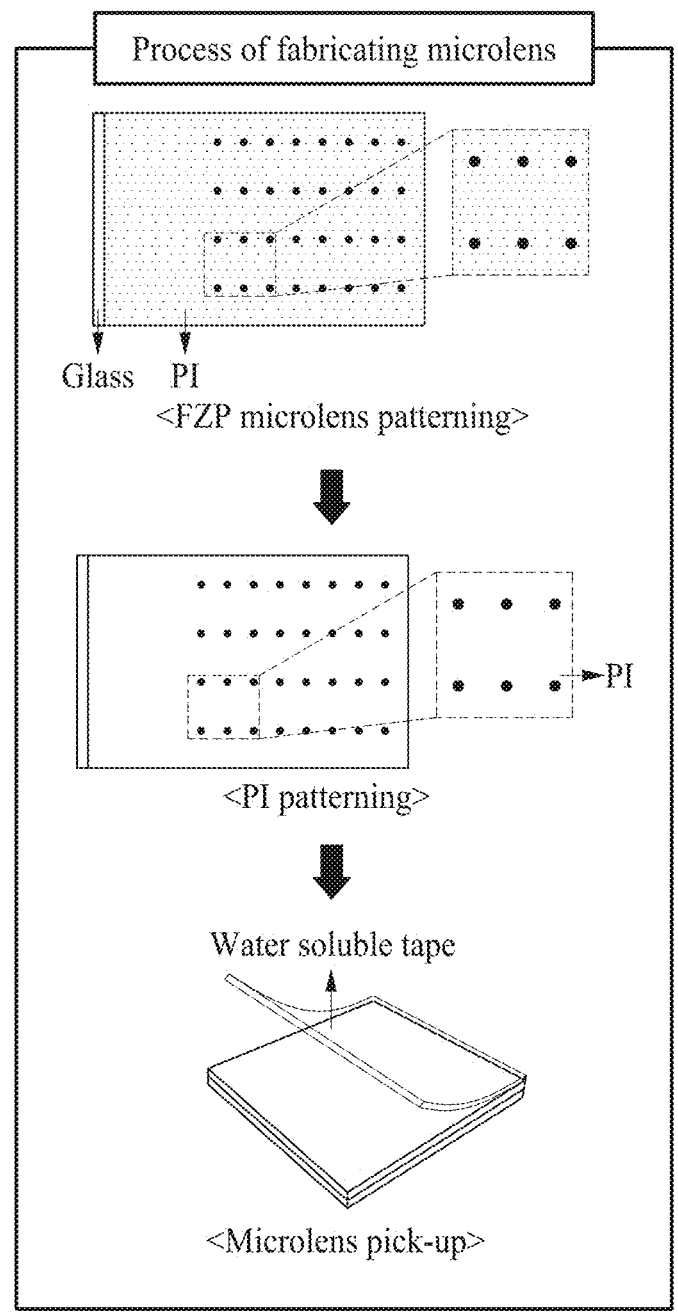
FIG. 10 is a diagram illustrating an example of a process of fabricating a microlens according to an exemplary embodiment.

FIG. 10 is a diagram illustrating an example of a process of fabricating a microlens according to an exemplary embodiment.

Referring to FIG. 10, a plurality of microlenses 115 may have a plurality of arrays. The plurality of microlenses 115 may be implemented as, for example, Fresnel zone plates (FZPs).

Using the FZPs, the photodiode 111 and the microlenses 115 may be more easily aligned. Also, a flexible microlens 115 as an FZP may be thinner than a convex microlens.

An FZP may be fabricated by coating SiO2 with a PI layer, by forming a metal layer (for example, an Au/Cr layer) on the PI layer through a thermal vacuum evaporation, and by patterning the metal layer. The patterned metal layer may be coated with the PI layer for encapsulation. Patterning and etching may be performed on the FZP, and accordingly a lens region may remain.

Figure 11:
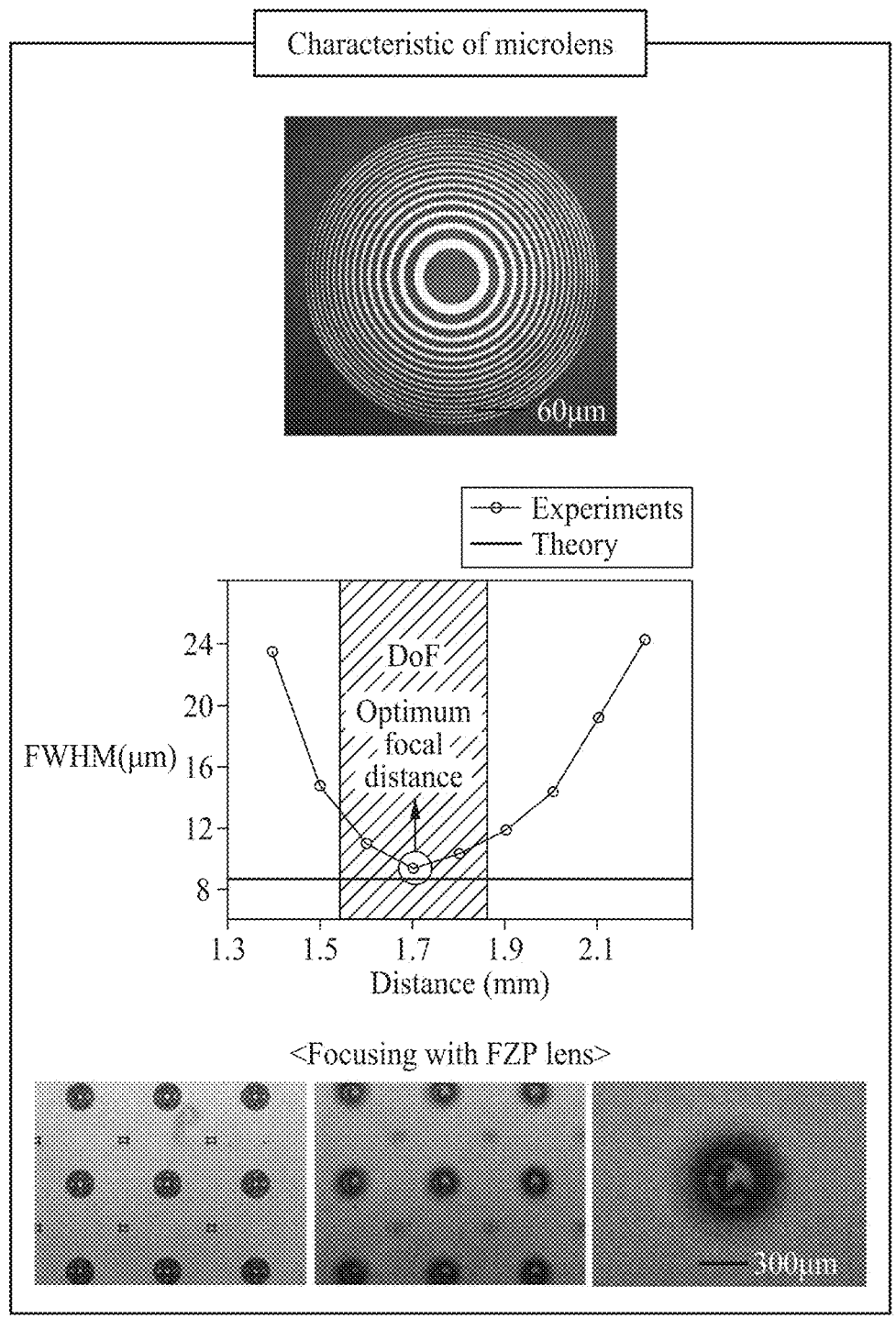
FIG. 11 is a diagram illustrating a characteristic of the microlens of FIG. 10.

FIG. 11 is a diagram illustrating a characteristic of the microlens of FIG. 10.

A focal length of the microlens 115 may be adjusted by adjusting an interval between binary patterns of a metal. An image may be acquired by emitting light having a predetermined shape to the microlens 115.

The microlens 115 may have an optimum focal length at 1.7 millimeters (mm).

Figure 12:
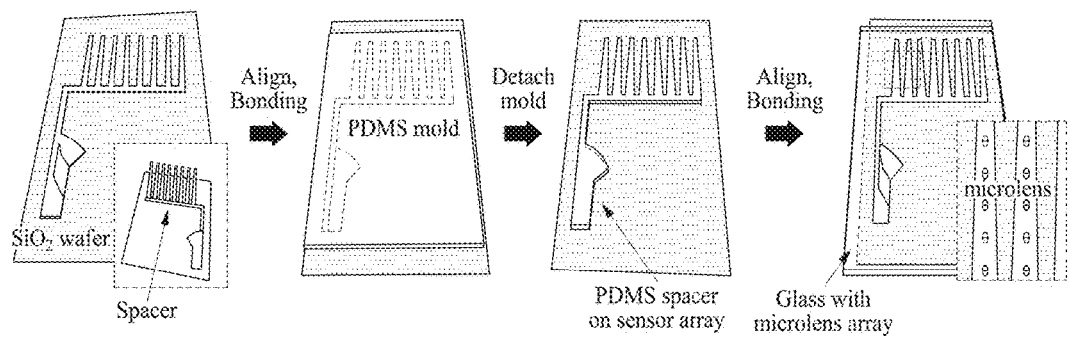
FIG. 12 is a diagram illustrating an example of a bonding process using a transfer printing process according to an exemplary embodiment.

FIG. 12 is a diagram illustrating an example of a bonding process using a transfer printing process according to an exemplary embodiment.

For example, a plurality of photodiodes 111, a medium layer 113, and a plurality of microlens 115 may be bonded using transfer printing.

A layer having a thickness corresponding to an optimum focal length may be formed using a photoresist, and a photoresist pattern with the same shape as that of a PDMS medium layer may be formed using a photolithograph. For example, SU8-100 may be used as a photoresist.

A PDMS solution may be poured into the formed photoresist pattern and may be solidified. The solidified resultant may be detached from the photoresist pattern, to form a PDMS mold with the same shape as that of the photoresist pattern. A silanization may be performed on the PDMS mold, and the PDMS mold may be filled with the PDMS solution, to form a medium layer 113.

Using the medium layer 113, a focal length between a microlens 115 and a photodiode 111 may be adjusted.

For example, the PDMS mold and the medium layer may be prepared using a PDMS solution with a ratio of "15:1."

A PI layer included in a top portion of the photodiode 111 may be treated with 3-glycidoxypropyltrimethoxysilane (GPTMS), to form an epoxy group. Also, PDMS used to form the medium layer may be treated with 3-mercaptopropyltrimethoxysilane (MPTMS), to form a thiol group.

Through a thiol-epoxy click reaction, the medium layer 113 may be moved from the PDMS mold to the top portion of the photodiode 111.

Also, an epoxy group may be formed on a PI layer of an FZP that forms a microlens 115, using GPTMS, and an alignment process with the top portion of the photodiode 111 may be performed.

The microlens 115 may be bonded to the top portion of the photodiode 111 bonded to the medium layer 113 using a thiol-epoxy reaction.

Figure 13:
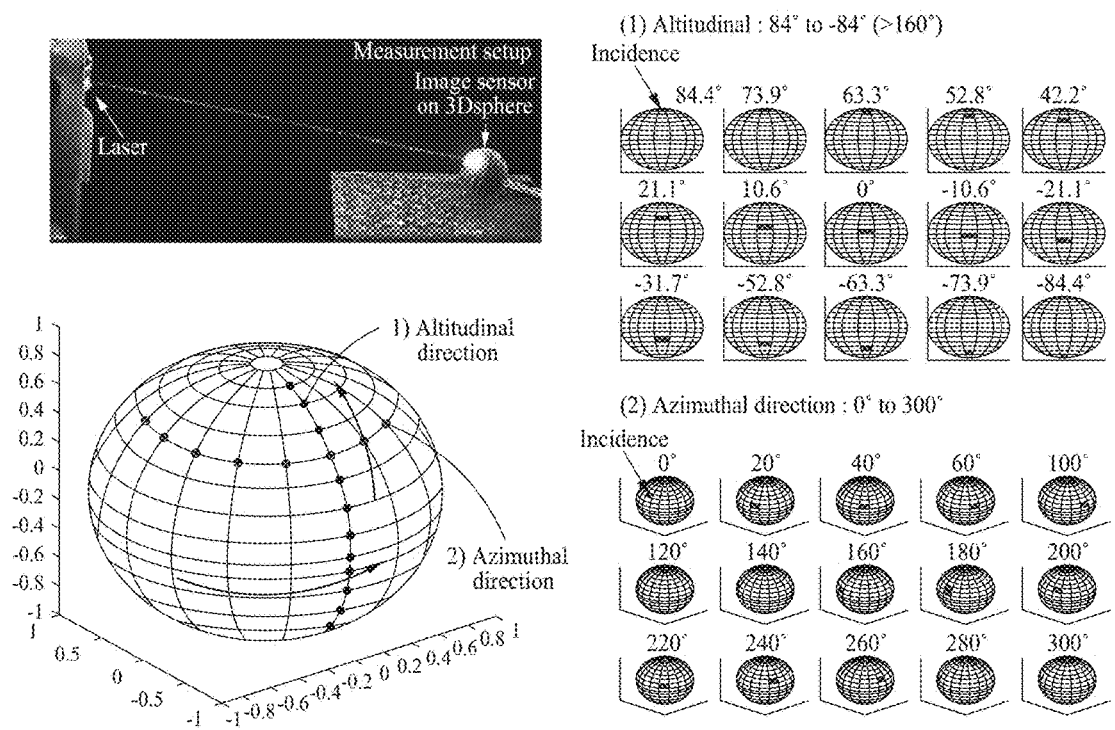
FIG. 13 is a diagram illustrating viewing angle measurement results of the image sensor of FIG. 3.
Figure 14:
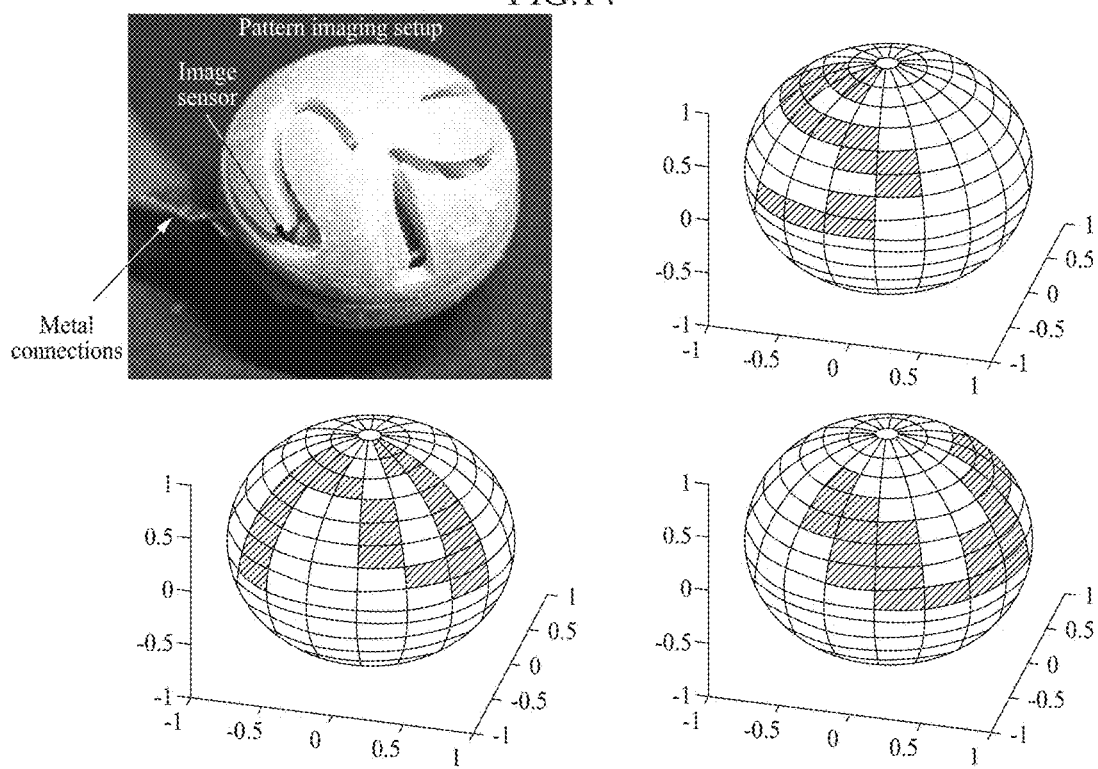
FIG. 14 is a diagram illustrating an example of results obtained by sensing patterned light by the image sensor of FIG. 3.

FIG. 13 is a diagram illustrating viewing angle measurement results of the image sensor 100 of FIG. 3, and FIG. 14 is a diagram illustrating an example of results obtained by sensing patterned light by the image sensor 100 of FIG. 3.

Referring to FIG. 13, a test may be performed through a laser spotting in a direction in which pixels are arranged.

Because photodiodes may enclose an entire surface of a spherical structure, the image sensor 100 may have a wider viewing angle. Based on the viewing angle measurement results of FIG. 13, the image sensor 100 may sense light in a region, for example, between 84 degrees and −84 degrees in an altitudinal direction, and may sense light in a region, for example, between 0 degrees and 300 degrees in an azimuthal direction.

Referring to FIG. 14, when a structure is covered with a mask patterned to have a 3D spherical shape, the image sensor 100 may recognize a pattern of the mask and may sense light.

The exemplary embodiments described herein may be implemented using hardware components, software components, or a combination thereof. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The method according to the above-described exemplary embodiments may be recorded in non-transitory computer-readable media including program instructions to implement various operations which may be performed by a computer. The media may also include, alone or in combination with the program instructions, data files, data structures, and the like. The program instructions recorded on the media may be those specially designed and constructed for the purposes of the exemplary embodiments, or they may be of the well-known kind and available to those having skill in the computer software arts. Examples of non-transitory computer-readable media include magnetic media such as hard disks, floppy disks, and magnetic tape; optical media such as CD ROM discs and DVDs, magneto-optical media such as optical discs, and hardware devices that are specially configured to store and perform program instructions, such as read-only memory (ROM), random access memory (RAM), flash memory, and the like. Examples of program instructions include both machine code, such as code produced by a compiler, and files containing higher level code that may be executed by the computer using an interpreter. The described hardware devices may be configured to act as one or more software modules in order to perform the operations of the above-described exemplary embodiments, or vice versa.

While this disclosure includes exemplary embodiments, it will be apparent to one of ordinary skill in the art that various changes in form and details may be made in these exemplary embodiments without departing from the spirit and scope of the claims and their equivalents. The exemplary embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor comprising:
   a plurality of photodiodes; and
   a structure comprising a plurality of protrusions,
   wherein the plurality of photodiodes are disposed between the plurality of protrusions,
   wherein the structure is a spherical structure comprising a plurality of spherical wedges.

2. The image sensor of claim 1, wherein
   each of the plurality of spherical wedges comprises a first spherical wedge with a first radius and a second spherical wedge with a second radius, and
   the spherical structure is configured by alternately connecting the first spherical wedge and the second spherical wedge to form the plurality of protrusions.

3. The image sensor of claim 2, wherein the plurality of photodiodes are located on a spherical lune of a spherical wedge with a smaller radius among the first spherical wedge and the second spherical wedge.

4. The image sensor of claim 1, wherein the plurality of photodiodes are encapsulated with an organic polymer.

5. The image sensor of claim 1, wherein the plurality of photodiodes are configured as lateral photodiodes.

6. The image sensor of claim 1, further comprising:
   a plurality of microlenses disposed on the plurality of photodiodes.

7. The image sensor of claim 6, wherein the plurality of microlenses are configured as Fresnel zone plates (FZPs).

8. The image sensor of claim 6, further comprising:
   a medium layer disposed between each of the plurality of microlenses and each of the plurality of photodiodes, respectively, and configured to adjust a focal length.

9. The image sensor of claim 8, wherein the plurality of photodiodes, the medium layer and the plurality of microlenses are bonded using transfer printing.

10. The image sensor of claim 8, wherein the medium layer is formed of polydimethylsiloxane (PDMS).

* * * * *